United States Patent
Liu et al.

(10) Patent No.: US 12,203,193 B2
(45) Date of Patent: Jan. 21, 2025

(54) PREPARATION METHOD FOR ULTRAHIGH-CONDUCTIVITY MULTILAYER SINGLE-CRYSTAL LAMINATED COPPER MATERIAL, AND COPPER MATERIAL

(71) Applicant: PEKING UNIVERSITY, Beijing (CN)

(72) Inventors: Kaihui Liu, Beijing (CN); Muhong Wu, Beijing (CN); Dapeng Yu, Beijing (CN); Enge Wang, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 206 days.

(21) Appl. No.: 17/798,116

(22) PCT Filed: Sep. 4, 2020

(86) PCT No.: PCT/CN2020/113536
§ 371 (c)(1),
(2) Date: Aug. 8, 2022

(87) PCT Pub. No.: WO2021/169234
PCT Pub. Date: Sep. 2, 2021

(65) Prior Publication Data
US 2023/0080832 A1    Mar. 16, 2023

(30) Foreign Application Priority Data
Feb. 27, 2020    (CN) .......................... 202010123961.7

(51) Int. Cl.
| B32B 15/01 | (2006.01) |
| B21B 3/00 | (2006.01) |
| C22F 1/08 | (2006.01) |
| C30B 29/02 | (2006.01) |
| C30B 29/68 | (2006.01) |
| C30B 33/02 | (2006.01) |

(52) U.S. Cl.
CPC ............... *C30B 29/68* (2013.01); *B21B 3/00* (2013.01); *B32B 15/01* (2013.01); *C22F 1/08* (2013.01); *C30B 29/02* (2013.01); *C30B 33/02* (2013.01); *B21B 2003/005* (2013.01)

(58) Field of Classification Search
CPC .... B21B 2003/005; B32B 15/01; C30B 33/00
See application file for complete search history.

(56) References Cited

U.S. PATENT DOCUMENTS

2018/0102197 A1    4/2018    Adams

FOREIGN PATENT DOCUMENTS

| CN | 101524721 A | 9/2009 |
| CN | 104928649 A | 9/2015 |
| CN | 105603514 A | 5/2016 |
| CN | 105714382 A | 6/2016 |
| CN | 106584976 A | 4/2017 |
| CN | 106629675 A | 5/2017 |
| CN | 106835260 A | 6/2017 |
| CN | 107904654 A | 4/2018 |
| CN | 108728813 A | 11/2018 |
| CN | 108754608 A | 11/2018 |
| CN | 109811175 A | 5/2019 |
| CN | 110079784 A | 8/2019 |
| CN | 110387575 A | 10/2019 |
| CN | 110561852 A | 12/2019 |
| CN | 111188086 A | 5/2020 |
| JP | 2014234330 A | 12/2014 |

OTHER PUBLICATIONS

Chinese Notification to Grant Pateny Right for Invention for corresponding application 202010123961.7; Dated Jun. 27, 2022.
Chinese Office Action for corresponding application 202010123961.7; Dated Nov. 27, 2020.
Chinese Office Action for corresponding application 202010123961.7; Dated Sep. 21, 2020.
Chinese Search Report for corresponding application 202010123961.7; Dated Nov. 27, 2020.
International Search Report for corresponding application PCT/CN2020/113536 filed Sep. 4, 2020; Mail date Dec. 16, 2020.

*Primary Examiner* — Adam Krupicka
(74) *Attorney, Agent, or Firm* — CANTOR COLBURN LLP

(57) ABSTRACT

Provided is a preparation method for an ultrahigh-conductivity multilayer single-crystal laminated copper material, where multiple layers of single-crystal copper foils are laminated together to form a laminate, and the laminate is pressurized and annealed as one piece by performing pressurizing and high-temperature annealing at the same time, or the laminate is pressed as one piece by means of direct hot rolling, thereby obtaining an ultrahigh-conductivity multilayer single-crystal laminated copper material, whereby, according to the method, multiple layers of single-crystal copper foils are used as raw materials, an ultrahigh-conductivity multi-layer single-crystal laminated copper material is prepared by means of hot rolling or pressing and annealing, and the conductivity of the copper material is greater than or equal to 105% IACS.

15 Claims, 1 Drawing Sheet

PREPARATION METHOD FOR ULTRAHIGH-CONDUCTIVITY MULTILAYER SINGLE-CRYSTAL LAMINATED COPPER MATERIAL, AND COPPER MATERIAL

CROSS-REFERENCES TO RELATED APPLICATIONS

The application claims priority to Chinese Patent Application No. 202010123961.7, entitled "Preparation Method for Ultrahigh-Conductivity Multilayer Single-Crystal Laminated Copper Material, and Copper Material" and filed with the Chinese Patent Office on Feb. 27, 2020, which is incorporated herein by reference in its entirety.

TECHNICAL FIELD

The present disclosure relates to a method for preparing an ultrahigh-conductivity multilayer single-crystal laminated copper material using a hot rolling process or a laminating and annealing process based on a multilayer single-crystal copper foil, and an ultrahigh-conductivity multilayer single-crystal laminated copper material prepared by the method.

BACKGROUND ART

Single-crystal copper exhibits many excellent electrical and mechanical properties due to the absence of defects such as grain boundaries and dislocation. For example, single-crystal Cu has lower resistance and alternating current impedance than those of polycrystalline Cu, for which an important reason is that electron scattering occurs at the grain boundary of polycrystalline Cu. This excellent electrical property of single-crystal Cu makes it have a very broad market prospect in the fields of traditional power transmission and new generation of electronic industry. Single-crystal superalloy, because of avoidance of grain boundary slippage, has more excellent creep resistance.

However, currently commercialized single-crystal metals, which are generally prepared by bulk crystal growth or thin film deposition on a substrate, are expensive and small in area, and cannot meet large-scale application requirements in the fields of microelectronic industry and traditional power transmission. Therefore, investigation of an effective means to obtain a single-crystal copper material with high conductivity is of great significance in its large-scale application in the fields of microelectronic industry and traditional power transmission.

SUMMARY

The present disclosure provides a preparation method for ultrahigh-conductivity multilayer single-crystal laminated copper material, comprising laminating multiple layers of single-crystal copper foils together to form a laminate, pressurizing and annealing the laminate as one piece by performing pressurizing and high-temperature annealing at the same time, or pressing the laminate as one piece by means of direct hot rolling, to prepare an ultrahigh-conductivity multilayer single-crystal laminated copper material; the method comprises steps of:

(I) placing the laminate into a mechanical pressurizing device or a pressurizing mold in an annealing furnace, applying a static pressure of 0.5 to 200 MPa, introducing, as protective gas, an inert gas at a flow rate of 200-2000 sccm and $H_2$ gas at a flow rate of 20-500 sccm, and then elevating the temperature; or wrapping the laminate with a high-temperature-resistant protective outer cladding, then placing it in front of a hot roller of a hot rolling mill in an atmospheric environment for rolling, and elevating the temperature of the hot roller;

(II) keeping the static pressure of 0.5 MPa to 200 MPa constant and keeping composition and flow rate of the introduced gas unchanged when the temperature of the annealing furnace is raised to 500-1100° C. to perform the pressurizing and annealing process; or keeping the pressure between the hot rollers of 0.5 MPa to 200 MPa constant when the temperature of the hot roller is raised to 500-1100° C., and slowly passing the laminate wrapped with the high-temperature-resistant protective outer cladding through the hot roller for hot rolling; and (III) after the end of the pressurizing and annealing process or the end of the hot rolling process, reducing the temperature to room temperature, to obtain the ultrahigh-conductivity multilayer single-crystal laminated copper material.

In one or more embodiments, the pressurizing and annealing process includes, but is not limited to, mechanical pressurizing and annealing or pressurizing and annealing using a pressurizing mold.

In one or more embodiments, two adjacent copper foils of the multiple layers of single-crystal copper foils are in contact with each other, and no other material is provided therebetween.

In one or more embodiments, the inert gas includes Ar or $N_2$.

In one or more embodiments, the high-temperature-resistant protective outer cladding includes felt, cloth, paper, or mesh made of graphite, boron nitride, ceramic fiber, asbestos, alumina fiber, mullite fiber, quartz fiber or mica fiber; or high-temperature-resistant metal iron, nickel, special steel, platinum, rhenium, tantalum, or tungsten.

In one or more embodiments, the retention time of pressurizing and annealing in step II is from 0.5 h to 100 h.

In one or more embodiments, the speed of the slowly passing through the hot roller for hot rolling in step II is 1-1000 cm/min.

In one or more embodiments, each layer of single-crystal copper foil in the multiple layers of single-crystal copper foils has the same crystal orientation.

In one or more embodiments, the multiple layers of single-crystal copper foils have the same or different thicknesses.

In one or more embodiments, each layer of single-crystal copper foil in the multiple layers of single-crystal copper foils has the same thickness, and the single layer of single-crystal copper foil has a thickness of 6 μm to 5 mm.

In one or more embodiments, each layer of single-crystal copper foil in the multiple layers of single-crystal copper foils has the same length and width or has a gradually smaller length and width in a direction upward along the stacking direction of the multiple layers of single-crystal copper foils.

In one or more embodiments, the laminate of the multiple layers of single-crystal copper foils has a reduction ratio y ranging from 0.1% to 20%.

In one or more embodiments, each layer of single-crystal copper foil in the multiple layers of single-crystal copper foils has the same crystal orientation, and the crystal orientation includes a low-index facet crystal orientation and a high-index facet crystal orientation. Here, the low-index facet crystal orientation refers to three index facets of Cu(001), Cu(011), and Cu(111); and the high-index facet crystal orientation refers to other index facets except three low-index facets of Cu(001), Cu(011), and Cu(111), including but not limited to Cu(012), Cu(013), Cu(014), Cu(023), Cu(025), Cu(034), Cu(112), Cu(113), Cu(115), Cu(122), Cu(123), Cu(133), Cu(159), Cu(223), Cu(233), Cu(234), Cu(235), Cu(245), Cu(255), Cu(256), Cu(335), Cu(337), Cu(344), Cu(345), Cu(346), Cu(355), Cu(356), Cu(357), Cu(359), Cu(377), Cu(455), Cu(456), or Cu(577), etc.

In one or more embodiments, the ultrahigh-conductivity multilayer single-crystal laminated copper material is prepared by the method described herein.

In one or more embodiments, the ultrahigh-conductivity multilayer single-crystal laminated copper material has a thickness of 0.05 mm to 100 cm, a width of 0.05 mm to 500 cm, and a length of 1 cm to 5000 m.

In one or more embodiments, the ultrahigh-conductivity multilayer single-crystal laminated copper material has a conductivity greater than or equal to 105% IACS.

In one or more embodiments, the ultrahigh-conductivity multilayer single-crystal laminated copper material has a conductivity of 108% IACS to 115% IACS.

In one or more embodiments, its characteristic lies in that the multilayer single-crystal laminated copper material is a plate, a block, or a strip, and can be reprocessed into a bar, a pipe, a wire, or a copper clad plate.

In one or more embodiments, the ultrahigh-conductivity multilayer single-crystal laminated copper material may be used in the fields of microelectronic industry and traditional power transmission, including, but not limited to, transmission cables, wires, coils for generators and motors, conducting bar for a rotor/stator, transformer coils, copper clad plates, electrode materials, bonding leads, conductive materials for antennas and radio frequency circuit, signal transmission lines, etc.

In one or more embodiments, each layer of single-crystal copper foil in the multiple layers of single-crystal copper foils has the same crystal orientation, and the ultrahigh-conductivity multilayer single-crystal laminated copper material has the same crystal orientation as the crystal orientation of each layer of single-crystal copper foil.

In one or more embodiments, the crystal orientation includes a low-index facet crystal orientation and a high-index facet crystal orientation. The low-index facet crystal orientation is preferably selected from Cu(001), Cu(011), and Cu(111); and the high-index facet crystal orientation preferably includes, but is not limited to, Cu(012), Cu(013), Cu(014), Cu(023), Cu(025), Cu(034), Cu(112), Cu(113), Cu(115), Cu(122), Cu(123), Cu(133), Cu(159), Cu(223), Cu(233), Cu(234), Cu(235), Cu(245), Cu(255), Cu(256), Cu(335), Cu(337), Cu(344), Cu(345), Cu(346), Cu(355), Cu(356), Cu(357), Cu(359), Cu(377), Cu(455), Cu(456), or Cu(577). Preferably, the crystal orientation is Cu(111).

The present disclosure provides an ultrahigh-conductivity multilayer single-crystal laminated copper product made of the ultrahigh-conductivity multilayer single-crystal laminated copper material as described herein.

In one or more embodiments, the ultrahigh-conductivity multilayer single-crystal laminated copper product is a bar, a pipe, a wire, or a copper clad plate.

Provided herein is use of multiple layers of single-crystal copper foils in preparation of an ultrahigh-conductivity multilayer single-crystal laminated copper material.

In one or more embodiments, the multiple layers of single-crystal copper foils have the same or different thicknesses.

In one or more embodiments, each layer of single-crystal copper foil in the multiple layers of single-crystal copper foils has the same thickness, and the single layer of single-crystal copper foil has a thickness of 6 μm to 5 mm.

In one or more embodiments, each layer of single-crystal copper foil in the multiple layers of single-crystal copper foils has the same length and width, or has a gradually smaller length and width in a direction upward along the stacking direction of the multiple layers of single-crystal copper foils.

In one or more embodiments, the reduction ratio y of the laminate of the multiple layers of single-crystal copper foils relative to the ultrahigh-conductivity multilayer single-crystal laminated copper material is in a range of 0.1%-20%.

In one or more embodiments, each layer of single-crystal copper foil in the multiple layers of single-crystal copper foils has the same crystal orientation.

In one or more embodiments, the crystal orientation includes a low-index facet crystal orientation and a high-index facet crystal orientation. The low-index facet crystal orientation is preferably selected from Cu(001), Cu(011), and Cu(111); and the high-index facet crystal orientation preferably includes, but is not limited to, Cu(012), Cu(013), Cu(014), Cu(023), Cu(025), Cu(034), Cu(112), Cu(113), Cu(115), Cu(122), Cu(123), Cu(133), Cu(159), Cu(223), Cu(233), Cu(234), Cu(235), Cu(245), Cu(255), Cu(256), Cu(335), Cu(337), Cu(344), Cu(345), Cu(346), Cu(355), Cu(356), Cu(357), Cu(359), Cu(377), Cu(455), Cu(456), or Cu(577). Preferably, the crystal orientation is Cu(111).

In one or more embodiments, the high-index facet crystal orientation is any index facet other than the low-index facet crystal orientations.

In one or more embodiments, the crystal orientation is selected from Cu(001), Cu(011), Cu(111), Cu(012), Cu(013), Cu(014), Cu(023), Cu(025), Cu(034), Cu(112), Cu(113), Cu(115), Cu(122), Cu(123), Cu(133), Cu(159), Cu(223), Cu(233), Cu(234), Cu(235), Cu(245), Cu(255), Cu(256), Cu(335), Cu(337), Cu(344), Cu(345), Cu(346), Cu(355), Cu(356), Cu(357), Cu(359), Cu(377), Cu(455), Cu(456), and Cu(577).

BRIEF DESCRIPTION OF DRAWINGS

In order to illustrate the technical solutions of the embodiments of the present disclosure more clearly, the drawings to be used in the embodiments will be briefly described below. It should be appreciated that the following drawings illustrate merely certain embodiments of the present disclosure, and are therefore not considered as limiting the scope. Other related drawings may be obtained by those of ordinary skill in the art according to these drawings without creative efforts.

DETAILED DESCRIPTION OF THE EMBODIMENTS

Figure 1:
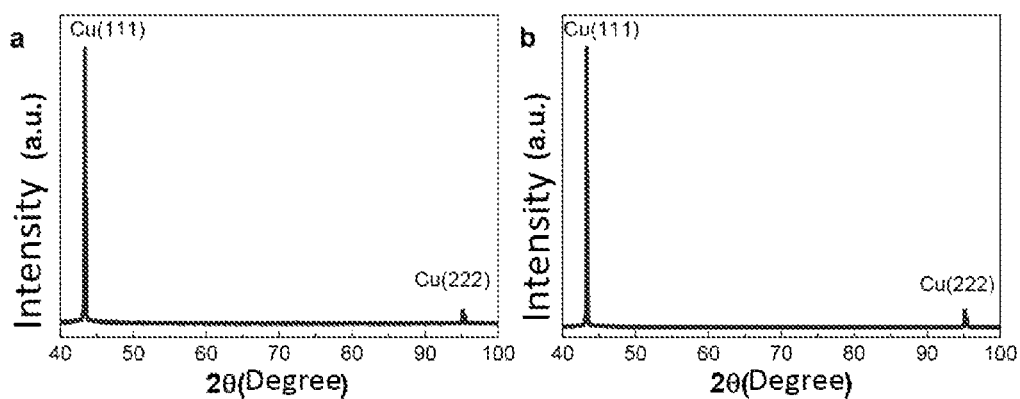
FIG. 1*a* shows an X-ray diffraction (XRD) result of a raw material single-crystal copper foil Cu(111)
FIG. 1B shows an X-ray diffraction (XRD) result of an ultrahigh-conductivity multilayer single-crystal laminated copper material according to a first embodiment of the present disclosure.

In order to make the objectives, technical solutions, and advantages of the embodiments of the present disclosure clearer, the technical solutions in the embodiments of the present disclosure will be clearly and completely described below. The embodiments for which specific conditions are not indicated are performed according to conventional conditions or conditions recommended by the manufacturer. The used reagents or instruments for which the manufacturers are not indicated are all conventional products that can be purchased from the market.

The present disclosure first provides a preparation method for an ultrahigh-conductivity multilayer single-crystal laminated copper material, in which multiple layers of single-crystal copper foils are laminated together, and the multiple layers of single-crystal copper foils are pressurized and annealed as one piece by performing mechanical pressurization or pressurization with a pressurizing mold while annealing at a high temperature, or by means of direct hot rolling, to prepare an ultrahigh-conductivity multilayer single-crystal laminated copper material. The multilayer single-crystal laminated copper material is an integral copper material formed by pressurizing and annealing multiple layers of single-crystal copper foils, is a plate, a block, or a strip, and can be reprocessed into a bar, a pipe, a wire, and a copper clad plate, rather than a multilayer material.

The present disclosure provides a preparation method for an ultrahigh-conductivity multilayer single-crystal laminated copper material, including laminating multiple layers of single-crystal copper foils together to form a laminate, pressurizing and annealing the laminate as one piece by performing pressurizing and high-temperature annealing at the same time, or pressing the laminate as one piece by means of direct hot rolling, to prepare an ultrahigh-conductivity multilayer single-crystal laminated copper material;

the method includes steps of:

(I) placing the laminate into a mechanical pressurizing device or a pressurizing mold in an annealing furnace, applying a static pressure of 0.5 MPa to 200 MPa, introducing, as protective gas, an inert gas at a flow rate of 200-2000 sccm and $H_2$ gas at a flow rate of 20-500 sccm, and then elevating the temperature; or wrapping the laminate with a high-temperature-resistant protective outer cladding, then placing it in front of a hot roller of a hot rolling mill in an atmospheric environment for rolling, and elevating the temperature of the hot roller;

(II) keeping the static pressure of 0.5 MPa to 200 MPa constant and keeping composition and flow rate of the introduced gas unchanged when the temperature of the annealing furnace is raised to 500-1100° C. to perform the pressurizing and annealing process; or keeping the pressure between the hot rollers of 0.5 MPa to 200 MPa constant when the temperature of the hot roller is raised to 500-1100° C., and slowly passing the laminate wrapped with the high-temperature-resistant protective outer cladding through the hot roller for hot rolling; and (III) after the end of the pressurizing and annealing process or the end of the hot rolling process, reducing the temperature to room temperature, to obtain the ultrahigh-conductivity multilayer single-crystal laminated copper material.

In step (I), the applied static pressure is 0.5 MPa to 200 MPa, for example, 1 MPa to 190 MPa, 3 MPa to 180 MPa, 5 MPa to 170 MPa, 7 MPa to 160 MPa, 9 MPa to 140 MPa, 11 MPa to 120 MPa, 13 MPa to 100 MPa, 14 MPa to 80 MPa, 15 MPa to 60 MPa, 16 MPa to 50 MPa, 17 MPa to 40 MPa, 18 MPa to 30 MPa, 19 MPa to 25 MPa, or 20 MPa to 22 MPa.

In step (I), the flow rate of the inert gas is 200-2000 sccm, for example, 210-1700 sccm, 220-1400 sccm, 230-1100 sccm, 240-800 sccm, 250-700 sccm, 260-600 sccm, 270-500 sccm, 280-450 sccm, 290-400 sccm, or 300-350 sccm.

In step (I), the flow rate of $H_2$ is 20-500 sccm, for example, 20-440 sccm, 40-410 sccm, 60-380 sccm, 80-350 sccm, 100-320 sccm, 120-290 sccm, 140-260 sccm, 160-250 sccm, 180-240 sccm, or 200-230 sccm.

In step (II), the annealing furnace temperature is 500-1100° C., for example, 500-1050° C., 550-1000° C., for example, 600-950° C., 650-900° C., 700-880° C., 750-850° C., or 800-830° C.

In step (II), the static pressure is 0.5 MPa to 200 MPa, for example, 1 MPa to 190 MPa, 3 MPa to 180 MPa, 5 MPa to 170 MPa, 7 MPa to 160 MPa, 9 MPa to 140 MPa, 11 MPa to 120 MPa, 13 MPa to 100 MPa, 14 MPa to 80 MPa, 15 MPa to 60 MPa, 16 MPa to 50 MPa, 17 MPa to 40 MPa, 18 MPa to 30 MPa, 19 MPa to 25 MPa, or 20 MPa to 22 MPa.

In step (II), the temperature of the hot roller is 500-1100° C., for example, 500-1050° C., 550-1000° C., for example, 600-950° C., 650-900° C., 700-880° C., 750-850° C., or 800-830° C.

In step (II), the pressure between the hot rollers is 0.5 MPa to 200 MPa, for example, 1 MPa to 190 MPa, 3 MPa to 180 MPa, 5 MPa to 170 MPa, 7 MPa to 160 MPa, 9 MPa to 140 MPa, 11 MPa to 120 MPa, 13 MPa to 100 MPa, 14 MPa to 80 MPa, 15 MPa to 60 MPa, 16 MPa to 50 MPa, 17 MPa to 40 MPa, 18 MPa to 30 MPa, 19 MPa to 25 MPa, or 20 MPa to 22 MPa.

In one or more embodiments, the pressurizing and annealing process includes, but is not limited to, mechanical pressurizing and annealing or pressurizing and annealing using a pressurizing mold.

In one or more embodiments, two adjacent copper foils of the multiple layers of single-crystal copper foils are in contact with each other, and no other material is provided therebetween.

In one or more embodiments, the inert gas includes Ar or $N_2$.

In one or more embodiments, the high-temperature-resistant protective outer cladding includes felt, cloth, paper, or mesh of graphite, boron nitride, ceramic fiber, asbestos, alumina fiber, mullite fiber, quartz fiber or mica fiber; or high-temperature-resistant metal iron, nickel, special steel, platinum, rhenium, tantalum, or tungsten.

In one or more embodiments, the retention time of pressurizing and annealing in step II is from 0.5 h to 100 h.

In one or more embodiments, the speed of slowly passing through the hot roller for hot rolling in step II is 1-1000 cm/min.

In one or more embodiments, each layer of single-crystal copper foil in the multiple layers of single-crystal copper foils has the same crystal orientation.

In one or more embodiments, the multiple layers of single-crystal copper foils have the same or different thicknesses.

In one or more embodiments, each layer of single-crystal copper foil in the multiple layers of single-crystal copper foils has the same thickness, and the single layer of single-crystal copper foil has a thickness of 6 μm to 5 mm, for example, the single layer of single-crystal copper foil has a thickness of 7 μm to 4 mm, 8 μm to 3 mm, 9 μm to 2 mm, 10 μm to 1 mm, 11 μm to 0.9 mm, 12 μm to 0.8 mm, 13 μm to 0.7 mm, 14 μm to 0.65 mm, 15 μm to 0.6 mm, 50 μm to 0.55 mm, 100 μm to 0.5 mm, 200 μm to 0.48 mm, 300 μm to 0.46 mm, or 400 μm to 0.44 mm.

In one or more embodiments, each layer of single-crystal copper foil in the multiple layers of single-crystal copper foils has the same length and width, or has a gradually smaller length and width in a direction upward along the stacking direction of the multiple layers of single-crystal copper foils.

In one or more embodiments, the laminate of the multiple layers of single-crystal copper foils has a reduction ratio y ranging from 0.1% to 20%.

The present disclosure further provides an ultrahigh-conductivity multilayer single-crystal laminated copper material prepared by any one of the methods described above.

In one or more embodiments, the ultrahigh-conductivity multilayer single-crystal laminated copper material has a thickness of 0.05 mm to 100 cm, a width of 0.05 mm to 500 cm, and a length of 1 cm to 5000 m. The thickness is, for example, 0.5 mm, 1 mm, 10 mm, 20 mm, 30 mm, 40 mm, 50 mm, 60 mm, 70 mm, 80 mm, 100 mm, 200 mm, 300 mm, 400 mm, 500 mm, 600 mm, 700 mm, 800 mm, or 900 mm; the width is, for example, 0.5 mm, 1 mm, 10 mm, 20 mm, 30 mm, 40 mm, 50 mm, 60 mm, 70 mm, 80 mm, 100 mm, 200 mm, 300 mm, 400 mm, 500 mm, 600 mm, 700 mm, 800 mm, 900 mm, 100 cm, 200 cm, 300 cm, 400 cm, or 450 cm; and the length is, for example, 10 cm, 20 cm, 30 cm, 40 cm, 50 cm, 60 cm, 70 cm, 80 cm, 90 cm, 1 m, 5 m, 10 m, 50 m, 100 m, 500 m, 1000 m, 1500 m, 2000 m, 2500 m, 3000 m, 4500 m, or 4800 m.

In one or more embodiments, the ultrahigh-conductivity multilayer single-crystal laminated copper material has a conductivity of greater than or equal to 105% IACS.

In one or more embodiments, the ultrahigh-conductivity multilayer single-crystal laminated copper material has a conductivity of 108% IACS to 115% IACS.

In one or more embodiments, the multilayer single-crystal laminated copper material is a plate, a block, or a strip, and can be reprocessed into a bar, a pipe, a wire, or a copper clad plate.

In one or more embodiments, the ultrahigh-conductivity multilayer single-crystal laminated copper material may be used in the fields of microelectronic industry and traditional power transmission, including, but not limited to, transmission cables, wires, coils for generators and motors, conducting bar for a rotor/stator, transformer coils, copper clad plates, electrode materials, bonding leads, conductive materials for antennas and radio frequency circuit, signal transmission lines, etc.

Advantages of the present disclosure are as follows.

1. The present disclosure proposes for the first time the preparation of an ultrahigh-conductivity multilayer single-crystal laminated copper material by hot rolling or laminating and annealing of multiple layers of single-crystal copper foils.

2. According to the present disclosure, a single-crystal copper foil is selected as a raw material, and the ultrahigh-conductivity multilayer single-crystal laminated copper material can be prepared without melting a copper material and recrystallizing it into single crystal, which greatly reduces the preparation cost.

3. The method of the present disclosure is simple, effective, and low in cost, and is conducive to practical application and industrial production of ultrahigh-conductivity multilayer single-crystal laminated copper materials.

The present disclosure provides a preparation method for an ultrahigh-conductivity multilayer single-crystal laminated copper material, including laminating multiple layers of single-crystal copper foils together to form a laminate, pressurizing and annealing the multiple layers of single-crystal copper foils as one piece by performing pressurizing and high-temperature annealing at the same time, or pressing the multiple layers of single-crystal copper foils as one piece by means of direct hot rolling, to prepare an ultrahigh-conductivity multilayer single-crystal laminated copper material; and the method includes steps of:

(I) placing the laminate into a mechanical pressurizing device or a pressurizing mold in an annealing furnace, applying a static pressure of 0.5 MPa to 200 MPa, introducing, as protective gas, an inert gas at a flow rate of 200-2000 sccm and $H_2$ gas at a flow rate of 20-500 sccm, and then elevating the temperature; or wrapping the laminate with a high-temperature-resistant protective outer cladding, then placing it in front of hot rollers of a hot rolling mill in an atmospheric environment for rolling, and elevating the temperature of the hot rollers; and (II) keeping the static pressure of 0.5 MPa to 200 MPa constant and keeping composition and flow rate of the introduced gas unchanged when the temperature is raised to 500-1100° C. to perform the pressurizing and annealing process; or keeping the pressure between the hot rollers of 0.5 MPa to 200 MPa constant when the temperature of the hot roller is raised to 500-1100° C., and slowly passing the laminate wrapped with the high-temperature-resistant protective outer cladding through the hot rollers for hot rolling; and (III) after the end of the pressurizing and annealing process or the end of the hot rolling process, reducing the temperature to room temperature, to obtain the ultrahigh-conductivity multilayer single-crystal laminated copper material.

In one or more embodiments, two adjacent copper foils of the multiple layers of single-crystal copper foils are in contact with each other, and no other material is provided therebetween.

Here, the inert gas includes Ar or $N_2$.

Here, the high-temperature-resistant protective outer cladding includes felt, cloth, paper, or mesh of high temperature resistant materials such as graphite, boron nitride, ceramic fiber, asbestos, alumina fiber, mullite fiber, quartz fiber, and mica fiber, and high-temperature-resistant metals such as iron, nickel, special steel, platinum, rhenium, tantalum, and tungsten.

In step II, the retention time of pressurizing and annealing is from 0.5 h to 100 h; and the speed of slowly passing through the hot rollers for hot rolling is 1-1000 cm/min.

XRD characterization is conducted for the single-crystal copper foil raw material before pressurizing and annealing or hot rolling and the multilayer single-crystal laminated copper material after pressurizing and annealing or hot rolling, and the results are shown in FIG. 1. It can be seen from FIG. 1 that the raw material single-crystal copper foil has only one diffraction peak from crystal orientation Cu(111) (FIG. 1a), and the ultrahigh-conductivity multilayer single-crystal laminated copper material subjected to hot rolling or pressurizing and annealing has only one diffraction peak from crystal orientation Cu(111) (FIG. 1B) as well, indicating that the ultrahigh-conductivity multilayer single-crystal laminated copper material maintains the crystal orientation of the raw material single-crystal copper foil, and the preparation process does not destroy the structure of the raw material. The electrical measurement results show that the prepared ultrahigh-conductivity multilayer single-crystal laminated copper material has a conductivity about 108% IACS to 115% IACS, has very excellent conductive property, and thus has a very wide application prospect in the fields of microelectronic industry and traditional power transmission. The ultrahigh-conductivity multilayer single-crystal laminated copper material can be used in the fields of microelectronic industry and traditional power transmission, including, but not limited to, transmission cables, wires, coils for generators and motors, conducting bar for a rotor/stator, transformer coils, copper clad plates, electrode materials, bonding leads, conductive materials for antennas and radio frequency circuit, and signal transmission lines, etc.

The ultrahigh-conductivity multilayer single-crystal laminated copper material prepared by the above method has a thickness of 0.05 mm to 100 cm, a width of 0.05 mm to 500 cm, and a length of 1 cm to 5000 m.

The single layer thickness of the single-crystal copper foil is 6 μm to 5 mm. In a specific embodiment, the single-crystal copper foil has a width of 0.05 mm to 500 cm and a length of 1 cm to 5000 m.

Each layer of single-crystal copper foil of the multiple layers of single-crystal copper foils has the same crystal orientation. In a specific example, the crystal orientation includes Cu(111).

In one or more embodiments, the multiple layers of single-crystal copper foils may have the same or different thicknesses. In a specific example, each layer of single-crystal copper foil in the multiple layers single-crystal copper foils has the same thickness, and a single layer of the single-crystal copper foil has a thickness of 6 μm to 5 mm.

In one or more embodiments, each layer of single-crystal copper foil of the multilayer single-crystal copper foil has the same length and width, or has a gradually smaller length and width in a direction upward along the stacking direction of the multiple layers of single-crystal copper foils.

In one or more embodiments, multiple layers of single-crystal copper foils are laminated together to form a laminate, and the number of layers is 2 to 200000, such as 20, 40, 60, 80, 100, 120, 140, 160, 180, 200, 220, 240, 260, 280, 300, 400, 500, 600, 700, 800, 900, 1000, 1500, 2000, 2500, 3000, 3500, 4000, 5000, 6000, 7000, 8000, 9000, 10000, 20000, 30000, 40000, 50000, 60000, 70000, 80000, 90000, 100000, 120000, 140000, 160000, or 180000.

In one or more embodiments, the reduction ratio y of the laminate of the multiple layers of single-crystal copper foils ranges from 0.1% to 20%. Here, the thickness before laminating is H, the thickness after laminating is h, the reduction amount is $\Delta h = H - h$, and the reduction ratio y is taken as $y = \Delta h / H$.

Here, for the preparation method of the single-crystal copper foil, reference can be made to Chinese Patent Documents CN201610098623.6, CN201610098625.5, CN201710020397.4, CN201710278012.4, CN201910144704.9, and CN 201910179992.1.

In a specific example, the method for preparing the single-crystal copper foil adopts local heating at a high temperature and driving a single small crystal domain or nucleation site to grow in a non-molten state at a high temperature, and a high-quality super-large single-crystal film is rapidly grown, directly or on a surface of a high-temperature-resistant substrate, wherein the width of the local high-temperature heating area is 0.005 to 5 cm; the method is carried out in a chemical or physical vapor deposition system with a local high-temperature heating apparatus, a rotating device (such as a roller or a rotating wheel) being arranged at both ends of the local high-temperature heating area of the chemical or physical vapor deposition system; the system includes a front end of the local high-temperature heating area, a local high-temperature heating area, and a rear end of the local high-temperature heating area, the rotating device including 10 first rotating wheels located at the front end of the local high-temperature heating area and 10 second rotating wheels located at the rear end of the local high-temperature heating area; the temperatures of the front end and the rear end of the local high-temperature heating area are 20-50° C., and the temperature of the local high-temperature heating area is 300-1400° C.; and the local high-temperature heating area is arranged a high-temperature-resistant isolation support having a number of layers equivalent to the number of the first rotating wheels or the second rotating wheels.

In one or more embodiments, the method comprises steps of:

(I) Placing a raw material or a required high-temperature-resistant substrate in a high-temperature-resistant isolation support, placing the insolation support on a local high-temperature heating apparatus, putting them into a chemical or physical vapor deposition apparatus, introducing Ar or $N_2$ at a flow rate of 300 sccm or higher, and then elevating the temperature for 1-15 min.

(II) Keeping the flow rate of inert gas constant when the temperature is raised rapidly to the required growth temperature of 300-1400° C., introducing the required gas at a proper flow rate at the same time to start the growth process.

(III) Rotating slowly the rotating wheels at both ends by controlling a driving device during the growth process, to enable one or more raw materials or the required high-temperature-resistant substrate to pass through the local high-temperature heating area at the same time, for performing continuous growth process.

(IV) After the growth is finished, turning off the heating power supply, stopping introduction of other gases, introducing only a protective gas, naturally cooling to room temperature, to grow a high-quality super-large single-crystal foil on one end of the rotating wheels or on the surface of the high-temperature-resistant substrate on the rotating wheels, that is, to complete continuous preparation of the super-large single-crystal foil.

In the step III, local high-temperature heating promotes growth of a single small crystal domain or nucleation site to prevent growth of other crystal domains or nucleation sites and absorb them, ensuring that only one crystal domain or nucleation site grows, and the prepared super-large single-crystal foil has only one crystal domain.

EXAMPLE

The present disclosure will be further described in detail below with reference to specific examples, and the methods are all conventional methods, unless noted otherwise.

The single-crystal copper foils used in the examples of the present disclosure were prepared using the method described in Chinese Patent Documents CN201610098623.6, CN201610098625.5, CN201710020397.4, CN201710278012.4, CN201910144704.9, CN201910179992.1, etc.

Example 1

The method of hot rolling or pressurizing and annealing multiple layers of single-crystal copper foils into an ultrahigh-conductivity multilayer single-crystal laminated copper material as one piece according to the present example was carried out through the following steps:

(I) 100 layers of single-crystal copper foils having a thickness of 25 μm and crystal orientation of Cu(111) were placed into a mechanical pressurizing device or a pressurizing mold in an annealing furnace, a static pressure of 20 MPa was applied, inert gas Ar at a flow rate of 1000 sccm and $H_2$ gas at a flow rate of 200 sccm were introduced as protective gas, and then the temperature was elevated; or the multiple layers of single-crystal copper foils were wrapped with a high-temperature-resistant protective outer cladding, then placed in front of a hot roller of a hot rolling mill in an atmospheric environment for rolling, and the temperature of the hot roller was elevated;

(II) the static pressure of 20 MPa was kept constant and the composition and flow rate of the introduced gas were kept unchanged when the temperature was raised to 800° C., to perform a pressurizing and annealing process; or the pressure of 20 MPa between the hot rollers was kept constant when the temperature of the hot roller was raised to 800° C., and the multiple layers of single-crystal copper foils wrapped with the high-temperature-resistant protective outer cladding were slowly passed through the hot roller for hot rolling; and (III) after the end of the pressurizing and annealing process or the end of the hot rolling process, the temperature was reduced to room temperature, to obtain the ultrahigh-conductivity multilayer single-crystal laminated copper material.

Example 2

The method of hot rolling or pressurizing and annealing multiple layers of single-crystal copper foils into an ultrahigh-conductivity multilayer single-crystal laminated copper material as one piece according to the present example was carried out through the following steps:

(I) 50 layers of single-crystal copper foils having a thickness of 25 μm and crystal orientation of Cu(111) and 50 layers of single-crystal copper foils having a thickness of 18 μm and crystal orientation of Cu(111) were placed in a cross-stacked manner into a mechanical pressurizing device or a pressurizing mold in an annealing furnace, a static pressure of 5 MPa was applied, inert gas $N_2$ at a flow rate of 2000 sccm and $H_2$ gas at a flow rate of 500 sccm were introduced as protective gas, and then the temperature was elevated; or the multiple layers of single-crystal copper foils were wrapped with a high-temperature-resistant protective outer cladding, then placed in front of a hot roller of a hot rolling mill in an atmospheric environment for rolling, and the temperature of the hot roller was elevated;

(II) the static pressure of 5 MPa was kept constant and the composition and flow rate of the introduced gas were kept unchanged when the temperature was raised to 900° C., to perform a pressurizing and annealing process; or the pressure of 5 MPa between the hot rollers was kept constant when the temperature of the hot roller was raised to 900° C., and the multiple layers of single-crystal copper foils wrapped with the high-temperature-resistant protective outer cladding were slowly passed through the hot roller for hot rolling; and (III) after the end of the pressurizing and annealing process or the end of the hot rolling process, the temperature was reduced to room temperature, to obtain the ultrahigh-conductivity multilayer single-crystal laminated copper material.

Comparative Example: multiple layers of polycrystalline copper foils were used as a raw material for hot rolling or pressurizing and annealing, rather than multiple layers of single-crystal copper foils as a raw material, and the following steps were performed:

I. multiple layers of polycrystalline copper foils were placed into a mechanical pressurizing device or a pressurizing mold in an annealing furnace, a static pressure of 20 MPa was applied, inert gas Ar at a flow rate of 1000 sccm and $H_2$ gas at a flow rate of 200 sccm were introduced as protective gas, and then the temperature was elevated; or the multiple layers of polycrystalline copper foils were wrapped with a high-temperature-resistant protective outer cladding, then placed in front of a hot roller of a hot rolling mill in an atmospheric environment for rolling, and the temperature of the hot roller was elevated;

II. the static pressure of 20 MPa was kept constant and the composition and flow rate of the introduced gas were kept unchanged when the temperature was raised to 800° C., to perform a pressurizing and annealing process; or the pressure of 20 MPa between the hot rollers was kept constant when the temperature of the hot roller was raised to 800° C., and the multiple layers of polycrystalline copper foils wrapped with the high-temperature-resistant protective outer cladding were slowly passed through the hot roller for hot rolling; and III. after the end of the pressurizing and annealing process or the end of the hot rolling process, the temperature was reduced to room temperature, to obtain the multilayer polycrystalline laminated copper material of the comparative example.

Figure 2:
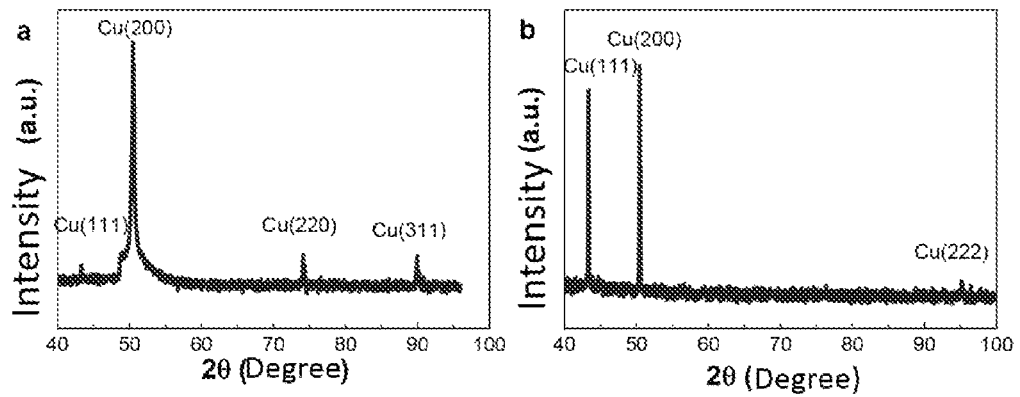
FIG. 2*a* shows an X-ray diffraction (XRD) result of a raw material polycrystalline copper foil in a comparative example.
FIG. 2*b* shows an X-ray diffraction (XRD) result of a laminated copper material made of the polycrystalline copper foil after hot rolling or pressurizing and annealing.

XRD characterization was performed for the polycrystalline copper foil raw material before pressurizing and annealing or hot rolling and the multilayer polycrystalline laminated copper material after pressurizing and annealing or hot rolling, and the results are shown in FIG. 2. It can be seen from FIG. 2 that the raw material polycrystalline copper foil includes diffraction peaks from a plurality of orientations (FIG. 2a), and the multilayer polycrystalline laminated copper material subjected to hot rolling or pressurizing and annealing includes diffraction peaks from a plurality of orientations (FIG. 2b), indicating that no multilayer single-crystal laminated copper material was obtained through the preparation process of pressurizing and annealing or hot rolling. The electrical measurement (in duplicate) was carried out for Example 1, Example 2 and Comparative Example, as shown in Table 1 below, the prepared multilayer polycrystalline laminated copper material of the comparative example had a conductivity about 85% IACS to 100% IACS, its conductive property was not much different from that of commercial polycrystalline copper foils. Whereas, the samples of Example 1 and Example 2 had a conductivity between 112% and 113%, which was significantly higher than that of Comparative Example. It can be seen that if no single-crystal copper foil is used as the raw material, the ultrahigh-conductivity multilayer single-crystal laminated copper material cannot be prepared by pressurizing and annealing or hot rolling.

TABLE 1

| | Conductivity Test | | | | | |
|---|---|---|---|---|---|---|
| Name | Sample 1: (Example 1) | Sample 2: (Example 1) | Sample 3: (Example 2) | Sample 4: (Example 2) | Sample 5: (Comparative Example) | Sample 6: (Comparative Example) |
| Conductivity | 112% IACS | 112.5% IACS | 113% IACS | 112% IACS | 92% IACS | 93% IACS |

The above description is merely the preferred embodiments of the present disclosure and is not intended to limit the present disclosure. For a person skilled in the art, the present disclosure may have various modifications and variations. Any modifications, equivalent substitutions, improvements and the like made within the spirit and principle of the present disclosure shall fall within the protection scope of the present disclosure.

INDUSTRIAL APPLICABILITY

According to the present disclosure, the single-crystal copper foil is selected as the raw material, so that the ultrahigh-conductivity multilayer single-crystal laminated copper material can be prepared without melting a copper material and recrystallizing it into single crystal. The method of the present disclosure is simple, effective, and low in cost, and is conducive to practical application and industrial production of ultrahigh-conductivity multilayer single-crystal laminated copper materials.

The invention claimed is:

1. A preparation method for an ultrahigh-conductivity multilayer single-crystal laminated copper material, comprising laminating multiple layers of single-crystal copper foils together to form a laminate, pressurizing and annealing the laminate as one piece by performing pressurizing and high-temperature annealing at the same time, or pressing the laminate as one piece by direct hot rolling, to fabricate the ultrahigh-conductivity multilayer single-crystal laminated copper material, wherein the method comprises steps of:
(I) placing the laminate into a mechanical pressurizing device or a pressurizing mold in an annealing furnace, applying a static pressure of 0.5 MPa to 200 MPa, introducing, as protective gas, an inert gas at a flow rate of 200-2000 sccm and $H_2$ gas at a flow rate of 20-500 sccm, and then elevating a temperature; or wrapping the laminate with a high-temperature-resistant protective outer cladding, then placing a resultant in front of hot rollers of a hot rolling mill in an atmospheric environment for rolling, and increasing a temperature of the hot rollers;
(II) keeping the static pressure of 0.5 MPa to 200 MPa constant and keeping composition and flow rate of the introduced gas unchanged when a temperature of the annealing furnace is raised to 500-1100° C. to perform a pressurizing and annealing process; or keeping a pressure between the hot rollers of 0.5 MPa to 200 MPa constant when the temperature of the hot rollers is raised to 500-1100° C., and slowly passing the laminate wrapped with the high-temperature-resistant protective outer cladding through the hot rollers for hot rolling; and
(III) reducing the temperature to room temperature, to obtain the ultrahigh-conductivity multilayer single-crystal laminated copper material when the pressurizing and annealing process or the hot rolling process ends.

2. The method according to claim 1, wherein the pressurizing and annealing process comprises mechanical pressurizing and annealing or pressurizing and annealing using a pressurizing mold.

3. The method according to claim 2, wherein each layer of single-crystal copper foil in the multiple layers of single-crystal copper foils has the same crystal orientation, and the crystal orientation comprises a low-index facet crystal orientation and a high-index facet crystal orientation; preferably, the low-index facet crystal orientation is selected from Cu(001), Cu(011), and Cu(111); preferably, the high-index facet crystal orientation comprises Cu(012), Cu(013), Cu(014), Cu(023), Cu(025), Cu(034), Cu(112), Cu(113), Cu(115), Cu(122), Cu(123), Cu(133), Cu(159), Cu(223), Cu(233), Cu(234), Cu(235), Cu(245), Cu(255), Cu(256), Cu(335), Cu(337), Cu(344), Cu(345), Cu(346), Cu(355), Cu(356), Cu(357), Cu(359), Cu(377), Cu(455), Cu(456), or Cu(577); and preferably, the crystal orientation is Cu(111).

4. The method according to claim 1, wherein two adjacent copper foils of the multiple layers of single-crystal copper foils are in contact with each other, and no other material is provided therebetween,
preferably, the inert gas comprises Ar or $N_2$;
preferably, the high-temperature-resistant protective outer cladding comprises felt, cloth, paper, or mesh made of graphite, boron nitride, ceramic fiber, asbestos, alumina fiber, mullite fiber, quartz fiber or mica fiber; or high-temperature-resistant metal iron, nickel, special steel, platinum, rhenium, tantalum, or tungsten;
preferably, a retention time of pressurizing and annealing in step II is from 0.5 h to 100 h;
preferably, a speed of slowly passing through the hot rollers for hot rolling in step II is 1-1000 cm/min;
preferably, each layer of single-crystal copper foil in the multiple layers of single-crystal copper foils has the same crystal orientation;
preferably, the multiple layers of single-crystal copper foils have the same or different thicknesses;
preferably, each layer of single-crystal copper foil in the multiple layers of single-crystal copper foils has the same thickness, and the single layer of single-crystal copper foil has a thickness of 6 μm to 5 mm;
preferably, each layer of single-crystal copper foil in the multiple layers of single-crystal copper foils has the same length and width, or has a gradually smaller length and width in a direction upward along a stacking direction of the multiple layers of single-crystal copper foils; and
preferably, the laminate of the multiple layers of single-crystal copper foils has a reduction ratio y ranging from 0.1% to 20%.

5. The method according to claim 4, wherein each layer of single-crystal copper foil in the multiple layers of single-crystal copper foils has the same crystal orientation, and the crystal orientation comprises a low-index facet crystal orientation and a high-index facet crystal orientation; preferably, the low-index facet crystal orientation is selected from Cu(001), Cu(011), and Cu(111); preferably, the high-index facet crystal orientation comprises Cu(012), Cu(013), Cu(014), Cu(023), Cu(025), Cu(034), Cu(112), Cu(113), Cu(115), Cu(122), Cu(123), Cu(133), Cu(159), Cu(223), Cu(233), Cu(234), Cu(235), Cu(245), Cu(255), Cu(256), Cu(335), Cu(337), Cu(344), Cu(345), Cu(346), Cu(355), Cu(356), Cu(357), Cu(359), Cu(377), Cu(455), Cu(456), or Cu(577); and preferably, the crystal orientation is Cu(111).

6. The method according to claim 1, wherein each layer of single-crystal copper foil in the multiple layers of single-crystal copper foils has the same crystal orientation, and the crystal orientation comprises a low-index facet crystal orientation and a high-index facet crystal orientation; preferably, the low-index facet crystal orientation is selected from Cu(001), Cu(011), and Cu(111); preferably, the high-index facet crystal orientation comprises Cu(012), Cu(013), Cu(014), Cu(023), Cu(025), Cu(034), Cu(112), Cu(113), Cu(115), Cu(122), Cu(123), Cu(133), Cu(159), Cu(223), Cu(233), Cu(234), Cu(235), Cu(245), Cu(255), Cu(256), Cu(335), Cu(337), Cu(344), Cu(345), Cu(346), Cu(355), Cu(356), Cu(357), Cu(359), Cu(377), Cu(455), Cu(456), or Cu(577); and preferably, the crystal orientation is Cu(111).

7. An ultrahigh-conductivity multilayer single-crystal laminated copper material, wherein the ultrahigh-conductivity multilayer single-crystal laminated copper material is prepared by the method according to claim 1.

8. The ultrahigh-conductivity multilayer single-crystal laminated copper material according to claim 7, wherein the ultrahigh-conductivity multilayer single-crystal laminated copper material has a thickness of 0.05 mm to 100 cm, a width of 0.05 mm to 500 cm, and a length of 1 cm to 5000 m;
preferably, the ultrahigh-conductivity multilayer single-crystal laminated copper material has a conductivity greater than or equal to 105% IACS; and
preferably, the ultrahigh-conductivity multilayer single-crystal laminated copper material has a conductivity of 108% IACS to 115% IACS.

9. The ultrahigh-conductivity multilayer single-crystal laminated copper material according to claim 8, wherein the multilayer single-crystal laminated copper material is a plate, a block, or a strip, and can be reprocessed into a bar, a pipe, a wire or a copper clad plate; and
preferably, the ultrahigh-conductivity multilayer single-crystal laminated copper material can be used in fields of microelectronic industry and traditional power transmission, including transmission cables, wires, coils for generators and motors, conducting bar for a rotor/stator, transformer coils, copper clad plates, electrode materials, bonding leads, conductive materials for antennas and radio frequency circuit, and signal transmission lines.

10. The ultrahigh-conductivity multilayer single-crystal laminated copper material according to claim 8, wherein each layer of single-crystal copper foil in the multiple layers of single-crystal copper foils has the same crystal orientation, and the ultrahigh-conductivity multilayer single-crystal laminated copper material has the same crystal orientation as the crystal orientation of the each layer of single-crystal copper foil.

11. The ultrahigh-conductivity multilayer single-crystal laminated copper material according to claim 7, wherein the multilayer single-crystal laminated copper material is a plate, a block, or a strip, and can be reprocessed into a bar, a pipe, a wire or a copper clad plate; and
preferably, the ultrahigh-conductivity multilayer single-crystal laminated copper material can be used in fields of microelectronic industry and traditional power transmission, including transmission cables, wires, coils for generators and motors, conducting bar for a rotor/stator, transformer coils, copper clad plates, electrode materials, bonding leads, conductive materials for antennas and radio frequency circuit, and signal transmission lines.

12. The ultrahigh-conductivity multilayer single-crystal laminated copper material according to claim 11, wherein each layer of single-crystal copper foil in the multiple layers of single-crystal copper foils has the same crystal orientation, and the ultrahigh-conductivity multilayer single-crystal laminated copper material has the same crystal orientation as the crystal orientation of the each layer of single-crystal copper foil.

13. The ultrahigh-conductivity multilayer single-crystal laminated copper material according to claim 7, wherein each layer of single-crystal copper foil in the multiple layers of single-crystal copper foils has the same crystal orientation, and the ultrahigh-conductivity multilayer single-crystal laminated copper material has the same crystal orientation as the crystal orientation of the each layer of single-crystal copper foil.

14. The ultrahigh-conductivity multilayer single-crystal laminated copper material according to claim 13, wherein the crystal orientation comprises a low-index facet crystal orientation and a high-index facet crystal orientation; preferably, the low-index facet crystal orientation is selected from Cu(001), Cu(011), and Cu(111); and preferably, the high-index facet crystal orientation comprises Cu(012), Cu(013), Cu(014), Cu(023), Cu(025), Cu(034), Cu(112), Cu(113), Cu(115), Cu(122), Cu(123), Cu(133), Cu(159), Cu(223), Cu(233), Cu(234), Cu(235), Cu(245), Cu(255), Cu(256), Cu(335), Cu(337), Cu(344), Cu(345), Cu(346), Cu(355), Cu(356), Cu(357), Cu(359), Cu(377), Cu(455), Cu(456), or Cu(577); and preferably, the crystal orientation is Cu(111).

15. An ultrahigh-conductivity multilayer single-crystal laminated copper product, wherein the ultrahigh-conductivity multilayer single-crystal laminated copper product is made of the ultrahigh-conductivity multilayer single-crystal laminated copper material according to claim 7, wherein the ultrahigh-conductivity multilayer single-crystal laminated copper product is a bar, a pipe, a wire, or a copper clad plate.

* * * * *